United States Patent [19]

Hurwitt et al.

[11] Patent Number: 5,130,005
[45] Date of Patent: Jul. 14, 1992

[54] MAGNETRON SPUTTER COATING METHOD AND APPARATUS WITH ROTATING MAGNET CATHODE

[75] Inventors: Steven Hurwitt, Park Ridge, N.J.; Robert Hieronymi, Rock Cavern; Israel Wagner, Monsey, both of N.Y.

[73] Assignee: Materials Research Corporation, Orangeburg, N.Y.

[21] Appl. No.: 626,987

[22] Filed: Dec. 13, 1990

Related U.S. Application Data

[63] Continuation-in-part of Ser. No. 606,701, Oct. 31, 1990, abandoned, which is a continuation-in-part of Ser. No. 570,943, Aug. 22, 1990, which is a continuation-in-part of Ser. No. 339,308, Apr. 17, 1989, Pat. No. 4,957,605.

[51] Int. Cl.$^5$ ............................................. C23C 14/35
[52] U.S. Cl. ........................... 204/192.12; 204/298.2; 204/298.09
[58] Field of Search .................. 204/192.12, 298.09, 204/298.2

[56] References Cited

U.S. PATENT DOCUMENTS

| | | | |
|---|---|---|---|
| 3,393,142 | 7/1968 | Moseson | 204/298.06 |
| 3,956,093 | 5/1976 | McLeod | 204/192.12 |
| 4,162,954 | 7/1979 | Morrison, Jr. | 204/298.19 |
| 4,180,450 | 12/1979 | Morrison, Jr. | 204/298.19 |
| 4,239,611 | 12/1980 | Morrison, Jr. | 204/298.19 |
| 4,265,729 | 5/1981 | Morrison, Jr. | 204/298.19 |
| 4,401,539 | 8/1983 | Abe et al. | 204/192.13 |
| 4,444,643 | 4/1984 | Garrett | 204/298.2 |
| 4,461,688 | 7/1984 | Morrison, Jr. | 204/192.12 |
| 4,498,969 | 2/1985 | Ramachandran | 204/192.12 |
| 4,525,264 | 6/1985 | Hoffman | 204/298.22 |
| 4,631,106 | 12/1986 | Nakazato et al. | 156/345 |
| 4,714,536 | 12/1987 | Freeman et al. | 204/298.2 |
| 4,746,417 | 5/1988 | Ferenbach et al. | 204/298.2 |
| 4,761,219 | 8/1988 | Sasaki et al. | 204/298.37 |
| 4,793,911 | 12/1988 | Kemmerer et al. | 204/298.27 |
| 4,892,633 | 1/1990 | Welty | 204/192.12 |
| 4,943,361 | 7/1990 | Kakehi et al. | 204/192.32 |
| 4,995,958 | 2/1991 | Anderson et al. | 204/298.2 |
| 5,026,470 | 6/1991 | Bonyhard et al. | 204/298.16 |

FOREIGN PATENT DOCUMENTS

| | | | |
|---|---|---|---|
| 0054201 | 6/1982 | European Pat. Off. | 204/298.37 |
| 0211412 | 7/1986 | European Pat. Off. | 204/298.2 |
| 0334347 | 3/1989 | European Pat. Off. | 204/298.2 |
| 0365249 | 10/1989 | European Pat. Off. | 204/298.2 |
| 2707144 | 8/1977 | Fed. Rep. of Germany | 204/298.2 |
| 59-215484 | 12/1984 | Japan | 204/298.2 |
| 61-291971 | 12/1986 | Japan | 204/298.2 |
| 63-149374 | 6/1988 | Japan | 204/298.2 |
| 63-290275 | 11/1988 | Japan | 204/298.2 |
| 63-307270 | 12/1988 | Japan | 204/298.2 |

*Primary Examiner*—Aaron Weisstuch
*Attorney, Agent, or Firm*—Wood, Herron & Evans

[57] ABSTRACT

A target of a thickness, which varies across its radius according to the amount of material required to be sputtered, is supported in a nest in a chamber of a sputter coating apparatus. Positioned behind the nest is a rotating magnet carrier having arranged thereon in a closed loop a permanent or electro magnetic strip, but preferably a flexible permanently magnetic material, with portions near the rim of the target and portions near, but not on, the target center about which the magnet rotates. The magnetic loop is transversely polarized with one pole toward the target rim and one toward the target center so that its field will enclose the rim of the target within a magnetic tunnel that traps a plasma over the target. Lumped magnets across the center from the strip support the plasma near the center so as to cause some sputtering at the target center. Other lumped magnets adjacent the strip help sharpen the field so that a desired distribution of sputtering can be achieved. Enclosed in a sealed space behind and in thermal contact with the target nest is the carrier from which the magnets project to facilitate the flow of cooling fluid across the back surface of the nest to cool the target as the carrier rotates.

22 Claims, 5 Drawing Sheets

FIG. I

MAGNETRON SPUTTER COATING METHOD AND APPARATUS WITH ROTATING MAGNET CATHODE

This application is a continuation-in-part of U.S. patent application Ser. No. 07/606,701, filed Oct. 31, 1990 entitled "Magnetron Sputter Coating Apparatus with Rotating Cathode Magnet," now abandoned, which is a continuation-in-part of U.S. patent application 07/570,943, filed Aug. 22, 1990 entitled "Sputter Coating Process Control Method and Apparatus," which is continuation-in-part of U.S. patent application Ser. No. 07/339,308, filed Apr. 17, 1989 entitled "Method and Apparatus for Sputter Coating Stepped Wafers," now U.S. Pat. No. 4,957,605.

FIELD OF THE INVENTION

The present invention relates to sputter coating and more particularly to magnetron enhanced sputter coating processes and apparatus employing magnets which are movable with respect to a sputtering cathode target.

BACKGROUND OF THE INVENTION

Sputter coating is a process carried out in a vacuum chamber which is filled with a generally chemically inert gas in which a substrate is coated with a material from a target of sputtering material subjected to a negative electrical potential with respect to the chamber wall or other anode. The potential gradient adjacent the target surface causes electrons to be emitted from the target which, on their way to the chamber anode which is usually formed in part by the grounded chamber wall, strike and ionize some of the inert gas. The positive ions formed are then attracted to the negative target which they strike, transferring momentum to the target material, and ejecting particles of the material from the target surface. The substrate to be coated, which is positioned in the chamber usually with its surface facing the target, receives some of the ejected particles which adhere to and coat the substrate surface.

With magnetron sputtering, a magnetic field is formed over the target surface, usually including magnetic field lines parallel to the target surface, and, in many applications, in the form of a closed magnetic tunnel. The magnetic field causes the electrons emitted to move in curved spiral paths which trap them in regions proximate the target surface enclosed by the field, thereby increasing the rate of electron collisions with gas atoms, which in turn increase the ionization of the gas and the efficiency of the sputtering process.

In the commonly assigned and copending U.S. patent application Ser. No. 07/339,308, filed Apr. 17, 1989, entitled "Method and Apparatus for Sputter Coating Stepped Wafers", now U.S. Pat. No. 4,957,605, expressly incorporated herein by reference, a sputter coating apparatus and method are disclosed in which a concave annular target is provided with concentric annular electromagnets which cause the formation of a pair of concentric plasma rings. The plasma rings are alternately energized by alternately supplying current to energize the magnet coils while the target power level is switched in synchronization with the switching of the current to the magnetic coils. This causes different rates of sputtering from inner and outer concentric regions of the target surface, with the sputtering from each region causing different distribution characteristics of the sputtered material deposited on the substrate or wafer being coated. Varying the relative parameters affecting the energization of the two target regions provides control of coating uniformity on the substrate surfaces, which is especially important on the differently facing surfaces of stepped semiconductor wafers. The aforereferenced patent application particularly describes effects on the coating caused by the target geometry and by the electrical parameters relating to the energization of the target and plasmas.

In magnetron sputter coating processes, the sputtering of materials from the sputtering target occurs most rapidly into regions of the target where the plasma trapped by the magnetic field is the most dense. This causes a proportionate consumption or erosion of the sputtering material from the target surface. The erosion of sputtering material from other portions of the sputtering target surface generally occurs at a rate which varies in proportion to the strength and/or duration of the plasma over that portion of the target surface.

In the prior art it has been proposed in certain applications to move the magnetic field in relation to the sputtering target surface either by movement of the target or movement of the magnetic field. A purpose of the relative movement of the target or magnetic field with respect to each other is, in many cases, to provide a more uniform erosion or consumption of the sputtering target material over the surface of the target. Such devices have for many reasons been unsatisfactory.

In sputtering from a sputtering target while moving the target with respect to the magnetic field, a desirable erosion pattern is sometimes achieved for purposes of uniformly consuming the target material, but often such a pattern does not provide the proper or desired distribution of sputter coating material onto the surface of the substrate being coated. Furthermore, such devices of the prior art have insufficiently controlled the distribution of the plasma or the duration of the moving plasma with respect to the target surface so as to affect a desired non-uniform erosion pattern.

In addition, rotating magnet devices of the prior art have not effectively provided for the sputtering of the entire surface of the target. It has been found that the absence of at least some sputtering from any given region of the target may cause redeposition of the material sputtering from elsewhere on the target onto those regions where no sputtering is occurring. This causes a build-up of sputtering material which is undesirable.

Accordingly, there is a need to provide a method and apparatus for sputter coating substrates which employs a magnet which is movable relative to the sputtering target and which is capable of precisely controlling the distribution of sputtering on the target surface in its entirety.

When the magnet structure and target are rotated relative to each other, the prior art devices have failed to provide for sufficient sputtering from certain regions of the target surface, such as the center and edge regions of the target, and further have failed to effectively distribute the sputtering across the target surface in a manner which is effective to produce the desired erosion pattern to yield the proper coating uniformity on the substrate.

SUMMARY OF THE INVENTION

It is an objective of the present invention to provide a sputtering coating method and apparatus in which a magnet, positioned behind a sputtering target opposite the sputtering surface to generate a plasma trapping closed magnetic field or tunnel over the sputtering target surface, is shaped and rotated so as to produce a desired average sputtering distribution across the surface of the target.

It is a more particular objective of the present invention to provide a rotating magnet magnetron sputtering apparatus that avoids unsputtered areas of the target, and thus avoids a buildup by redeposition of sputtered material on the target.

It is another objective of the present invention to provide a rotating magnet sputtering target apparatus and method having a magnet structure which is configurable to produce a desired coating deposition on the substrate when the magnet structure is rotated during sputtering.

It is a further objective of the present invention to provide the rotating magnet structure in a sputter coating apparatus wherein the rotating magnet structure facilitates the circulation of cooling fluid for the sputtering cathode assembly.

According to the principles of the present invention there is provided a sputter coating apparatus having a sputtering target included in a cathode assembly with a magnet located behind the sputtering target so as to produce a closed magnetic field over the target surface. The magnet is rotatably mounted so as to rotate the magnetic field over the surface of the sputtering target. The magnet is configured with respect to the target to cause sputtering from the center of the target to the outer rim of the target at a rate which varies with the radius from the center in a desired manner.

In the preferred and illustrated embodiment of the present invention, the magnet is preferably a permanent magnet which includes a closed loop of magnetic material formed of a flexible magnetic strip. The strip has its poles spaced transversely across the strip, preferably generally in the plane in which the closed loop lies. The magnet, which is formed of flexible laminated strips of magnet impregnated plastic, is arranged on a rotating plate behind the sputtering target in a shape having a plurality of curves including a plurality of outwardly convex curves, some near the outer rim of the target, and at least one point at which the strip passes near, but not through, the target center. The magnet is shaped in such a way that the plasma trapped by the magnetic field will be present over various portions of the sputtering target at various radii from the center for predetermined amounts of time so as to provide a desired erosion pattern on the target surface.

According to the preferred embodiment of the present invention, the magnet is polarized in such a way that one pole faces the outer edge of the rotating plate while the other pole faces the axis of rotation so that, particularly at the outer edge, the field emerges from the magnet and surrounds the outer rim of the target to facilitate sputtering from the target rim, without the need to provide an enlarged magnet structure extending beyond the target outer rim.

In addition, according to a preferred embodiment of the present invention, fixed lumped magnets of different magnetic material are positioned at various points along the magnetic loop so as to selectively influence portions of the magnetic field to provide certain desired field shapes. Particularly, according to certain preferred embodiments of the present invention, the lumped magnets are oriented with one pole toward the target and one away from the target so that the magnetic fields produced by the lumped magnets cooperate with the field provided by the magnetic loop to sharpen the field at various points. Particularly, certain of the lumped magnets are provided opposite the axis of rotation from the point of the loop where the magnet most closely approaches the axis. In this way, a small portion of the magnetic field, which does not otherwise extend across the central portion of the target, is drawn across the center to provide some degree of erosion to, and sputtering from, the central portion of the target. In addition, in accordance with certain embodiments of the present invention, the lumped magnets are provided at the outermost reaches of the loop near the edge of the target to shape the field more precisely in these regions.

In accordance with further objectives of the present invention, the target itself is shaped in a way to cooperate with the sputtering pattern created by the magnetic configuration so as to provide for a maximum utilization of the target material. In this respect, the target is of non-uniform thickness and is, for example, in the illustrated embodiment, more particularly thicker at the outer regions near the outer edge thereof.

In alternative embodiments, particularly where there may be some advantage to varying or adjusting the magnetic field strength, any of the magnets, and particularly the closed loop magnet, may be electromagnets.

In accordance with further objectives of the present invention, the target is bonded or otherwise secured in intimate heat conducting contact with a target nest. A closed cavity is provided behind the target nest enclosing the rotating magnet. A turbulent layer of water or other cooling fluid is maintained by injecting cooling water into the cavity behind the nest. The fluid is injected into the space near the center of the target assembly near the axis of rotation of the magnet so as to flow through a narrow space between the rotating magnet and the back surface of the target nest. In this space, the cooling fluid is propelled along the back surface of the nest and outwardly by the rotation of the magnet structure, and more particularly by the raised surface of the magnets themselves, so as to provide a turbulent skin of cooling water adjacent the surface of the nest improving the flow of the water and the These and other objectives and advantages of the present invention will be more readily apparent from the following detailed description of the drawings in which:

DETAILED DESCRIPTION OF DRAWINGS

Magnetron sputtering devices of the type to which the present invention relates are described in the following commonly assigned U.S. patents and copending patent applications which are hereby expressly incorporated in their entirety into this application by reference:

U.S. Pat. Nos. 4,909,695 and 4,915,564 entitled "Method and Apparatus for Handling and Processing Wafer-Like Materials"; and, U.S. patent application Ser. No. 07/339,308, filed Apr. 17, 1989, now U.S. Pat. No. 4,957,605, entitled "Method and Apparatus for Sputter Coating Stepped Wafers."

Figure 1:
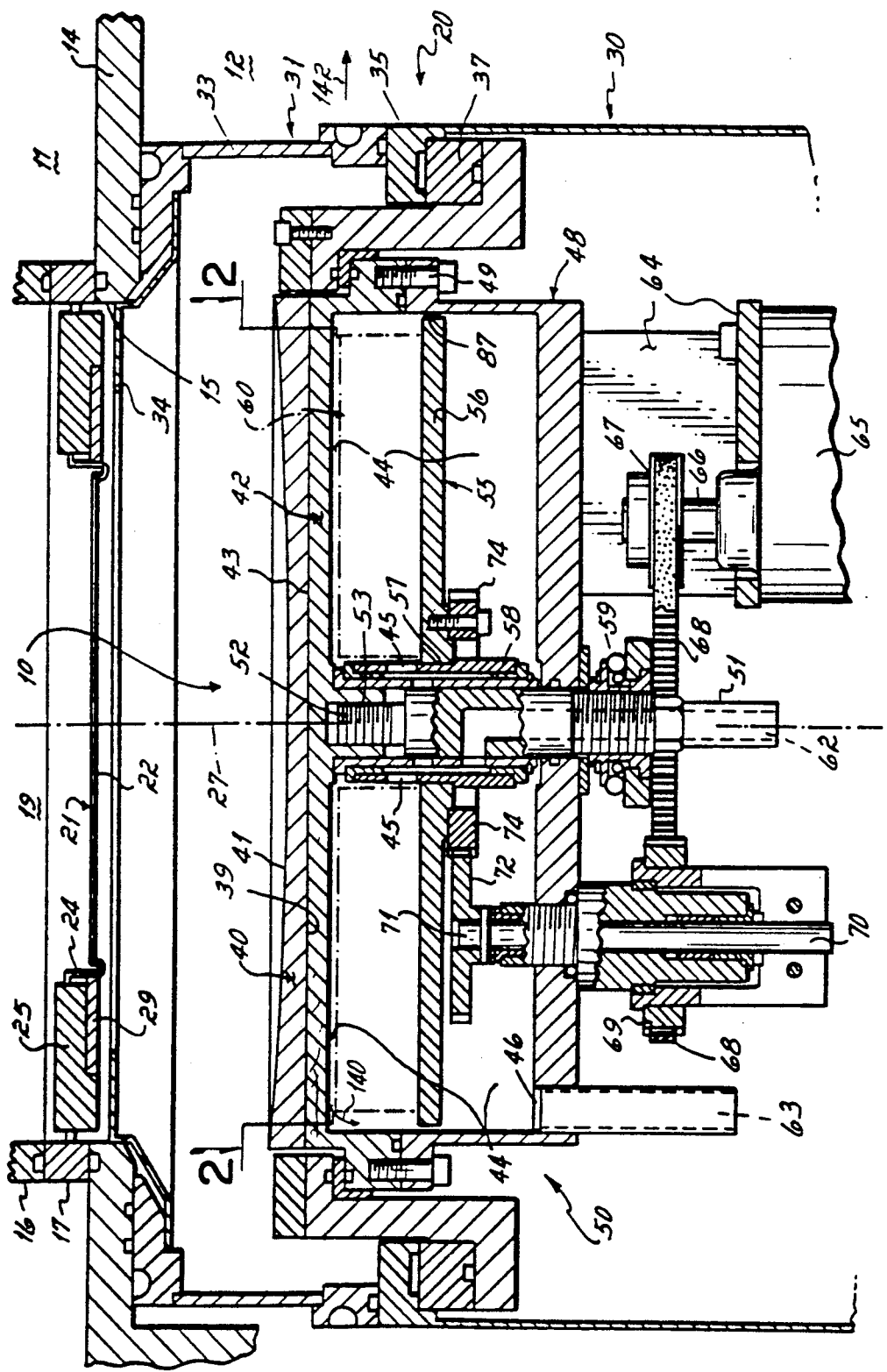
FIG. 1 is a cross-sectional view through a target assembly of one preferred embodiment of an apparatus embodying principles of the present invention.

FIG. 1 illustrates, in cross-section, a sputter coating processing chamber 10 of a sputter coating apparatus according to principles of the present invention. The chamber 10 is a portion of the sputter processing apparatus disclosed in U.S. Pat. No. 4,909,695. The processing chamber 10 is a vacuum processing chamber formed of an isolated section of a main chamber 11. The main chamber 11 is isolated from the atmosphere of the machine environment 12 by a plenum wall 14. The processing chamber 10 is capable of communicating with the main chamber 11 throughout opening 15 (shown sealed) in the plenum wall 14.

As more fully described in U.S. Pat. No. 4,909,695, the sealing of the opening 15 isolates the chamber 10 from the main processing chamber 11 by the selective movement of a processing chamber backplane section 16 against a portion of a disk shaped rotary wafer transport member 17 clamping the transport member 17 between the backplane section 16 and the plenum wall 14 in a sealing relationship (as shown), thereby enclosing a backplane space 19 within the processing chamber 10 and isolating the processing chamber 10 from the main chamber 11.

Opposite the backplane section 16, on the front plane side of the transport member 17, the processing chamber 10 is isolated from the machine environment 12 with a cathode assembly module 20 mounted in a vacuum sealing relationship against the plenum wall 14 surround the opening 15. The module 20, or processing chamber frontplane section, cooperates with the backplane section 16 and the transport member 17 to form the sealed isolated processing chamber which is isolated from both the main chamber 11 and the machine external environment 12.

Within the processing chamber 10 is a substrate or workpiece 21 in the form of a flat silicon wafer or disk which has the surface 22 upon which a coating is to be deposited in a sputter coating process to be performed within the processing chamber 10. The wafer 21 is held by a set of clips or other retaining devices 24 in a wafer holder 25 resiliently carried by the transport member 17. The transport member 17 is rotatable within the main chamber to bring the holder 25, and the workpiece or wafer 21 into alignment with the hole 15 so that the processing chamber 10 can be formed around the wafer 21 on the holder 25 by transverse movement of the backplane section 16 to move the member 17 against the plenum wall 14. The transport member portion 17 is a transversely movable ring carried by a rotatable index plate which is not shown, but described more fully in the above incorporated U.S. Pat. Nos. 4,909,675 and 4,915,564.

In this preferred embodiment, the wafer 21 is supported in a plane perpendicular to, and concentric with, a central axis 27 of the main chamber 10, which is also concentric with the hole 15 in the plenum wall 14. Surrounding the wafer 21 on the holder 25 is a disk 29 which at least partially protects the holder 25 from an excessive accumulation of coating intended for but which missed, the surface 22 of the wafer 21. Details of the sputtering apparatus of which the processing chamber 10 is a part including particularly details of the wafer transport 17, wafer holder 25, and backplane section 16, are described and illustrated in U.S. Pat. Nos. 4,909,695 and 4,915,564 incorporated by reference above.

The cathode assembly module 20 includes two assemblies, a removable cathode assembly 30 and a fixed assembly portion 31. The fixed assembly portion 31 is an annular enclosure rigidly mounted in sealed relationship against the plenum wall 14 surrounding the opening 15. It includes a cylindrical metal side wall 33 of the chamber 10. which is electrically grounded to the frame 14 of the plenum, a wafer holder shield 34 which surrounds the opening 15 and a chamber door frame assembly 35.

The cathode assembly 30 is mounted to a hinged door assembly 37 which removably but sealably supports the cathode assembly 30 to the fixed assembly 31. The cathode assembly 30 carries the sputtering target 40, which is a circular target having a continuous smooth concave sputtering surface 41 and a back surface 39. The assembly 30 supports the target 40 with its axis in alignment with the axis 27 of the chamber 10 and with its sputtering surface 41 facing the surface 22 of the wafer 21 to be coated.

The target 40 is supported in a target nest 42 having a front surface 43 conforming to surface 39 and concentric with axis 27. The back surface 39 of the target 40 is soldered or otherwise bonded to the front surface 43 of the nest 42, in intimate thermal contact therewith. The target back surface 39 is a cooling surface which, when the target 40 is mounted in holder 42, conforms to and lies in close cooling contact with the surface 43 of the holder 42. Behind the nest 42, opposite the cooling surface 43 thereof, is a space 44 for the circulation of cooling liquid, which is generally water, to remove heat generated in the target 40 during sputtering by cooling the heat conductive target holder 42. The cooling fluid is circulated into and out of the space 44 from an inlet port 45 to an outlet port 46 in a magnet assembly 50, as described below. The space 44 is enclosed behind the nest 42 by a housing structure 48 onto which the nest 42 is rigidly supported, and to which it is secured by bolts 49.

The shapes of the surfaces of the target 40 are preferably such that all the target 40 is capable of being formed by turning a block of sputtering material on a lathe. The target holder 40 is made of a heat conductive and electrically conductive material, preferably hard tempered OFHC copper or Alloy 110.

The magnet assembly 50 includes a shaft 51 having a threaded end 52 by which the shaft 51 is rigidly mounted in a threaded bore 53 at the center of the back surface of the nest 42. The assembly 50 also includes a rotatable magnet carrier assembly 55 which includes a circular disk 56 of non-magnetic stainless steel or other such material having a central hole 57 therein at which the disk 56 is rigidly mounted to a sleeve assembly 58 rotatably mounted through a bearing assembly through the housing 48 and to the nest 42 to rotate about the shaft 51 on the axis 27. The rotatable magnet assembly further includes a magnet structure 60 rigidly mounted on the disk 56 to rotate therewith. The magnet 60 surrounds the axis 27 and lies beneath or behind the nest 42, opposite the front surface 43 thereof, and close enough thereto to generate a closed magnetic field above the sputtering surface 41 of the target 40 mounted on the surface 43 of the nest 42.

The shaft 51 has a cooling fluid inlet duct 62 extending therethrough which communicates with the inlet port 45 to the interior cooling chamber 44 between the nest 42 and the housing 48. The housing 48 has mounted near the edge thereof a cooling fluid outlet duct 63 which communicates with the fluid outlet port 46 in the cooling space 44.

Figure 3:
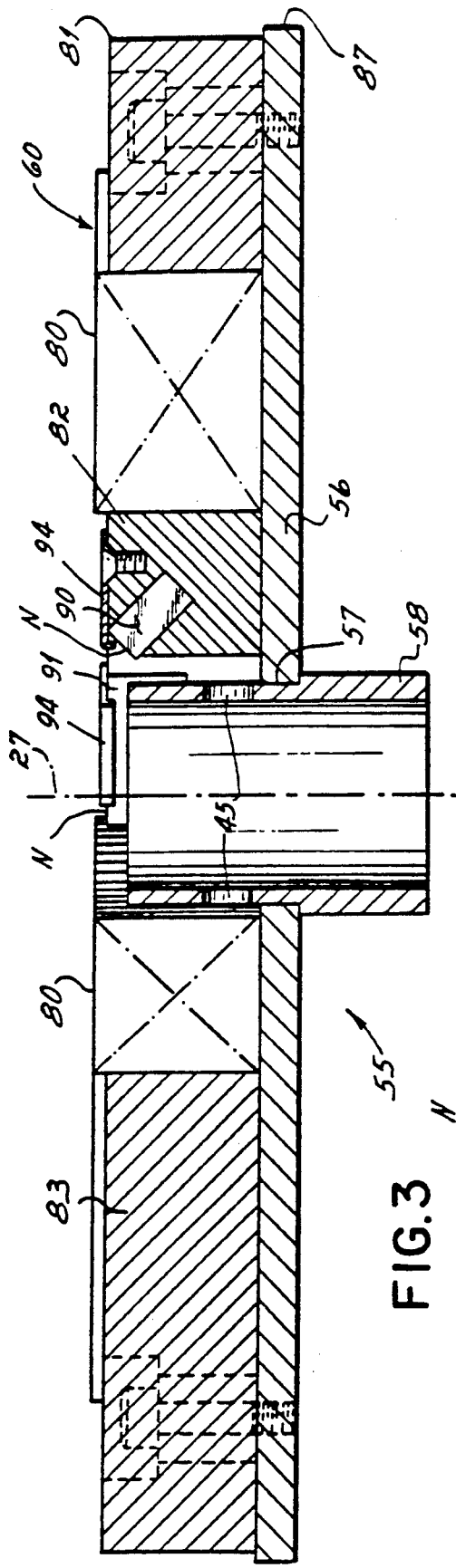
FIG. 3 is a cross-sectional view along lines 3—3 of FIG. 2.
Figure 4:
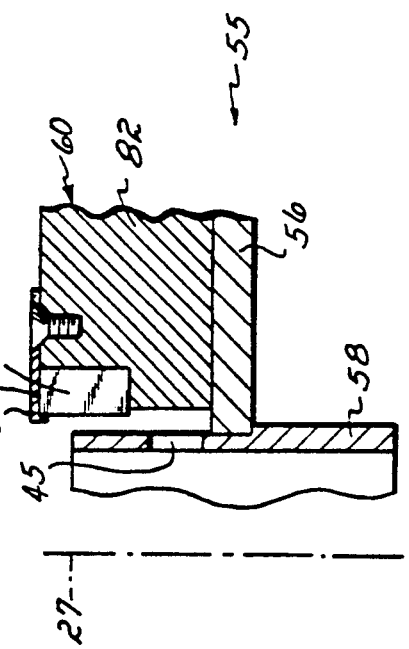
FIG. 4 is a fragmentary cross-sectional view along lines 4—4 of FIG. 2.

Mounted to the back of the housing 48 is a bracket 64 to which is mounted a magnet rotary drive motor 65. The motor 65 has an output shaft 66 with a cogged drive wheel 67 mounted at the end thereof for driving a cogged drive belt 68. The belt 68 extends around a cogged drive wheel 69 attached to a drive shaft 70 which is rotatably mounted on the housing 48 extending therethrough and having a free end 71 to which is mounted a drive gear 72. The drive gear 72 is positioned within the space 44 where it engages a mating gear 74 attached to the disk 56 of the rotatable magnet assembly 55. Accordingly, the motor 65, when energized, rotates the magnet assembly 55 to rotate the magnet 60 behind the target nest 42 to rotate the magnetic field over the sputtering surface 41 of the target 40. The details of the construction of the magnet structure 60 and its arrangement on the magnet assembly 55 can be better understood by reference to FIGS. 2-4.

Figure 2:
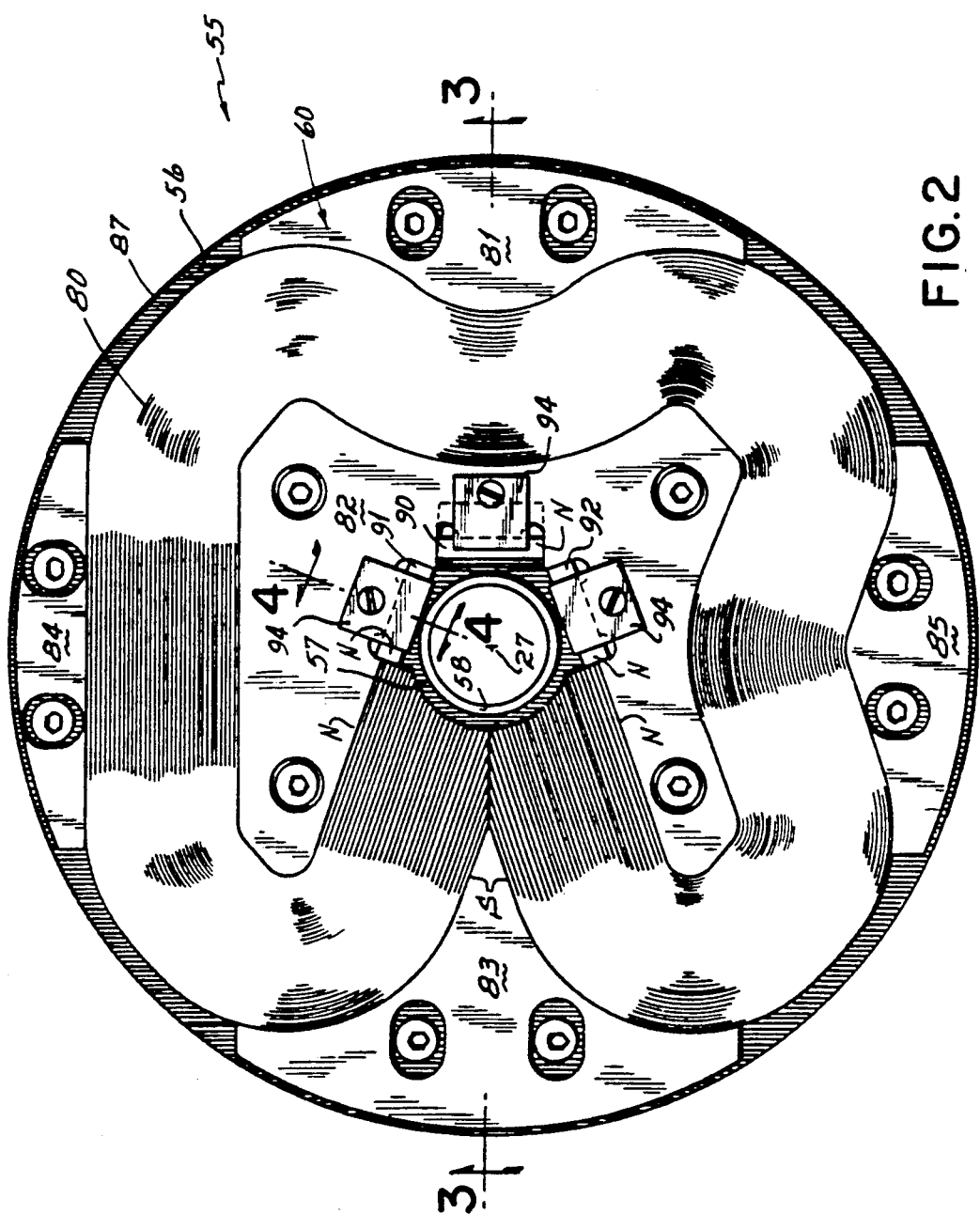
FIG. 2 is a view taken generally along lines 2—2 of FIG. 1 illustrating the face of the rotatable plate and magnet assembly.

Referring to FIG. 2, according to one preferred embodiment of the present invention, the magnet structure 60 is shown supported on the disk or plate 56. The magnet structure 60 is a strip of flexible magnet impregnated plastic made up of a laminated plurality of flexible plastic magnetic ribbons 80, for example 24 in number, arranged in a closed irregular loop on the plate 56. The shape of the magnet 80 is selected such that, as the magnet rotates, the strength and duration of the plasma at any given radius of the target will cause sputtering at a predetermined desired average rate necessary to produce a desired coating distribution on the target. The thickness of the target 40 is further varied across the radius of the target to supply material in proportion to the demands of the sputtering distribution.

The ribbon magnet 80 is held in place in a particular predetermined shape surrounding axis 27 by five clamping blocks 81-85. The ribbons of the magnet 80 are polarized in such a way that one pole of the magnet formed thereby faces outwardly toward the outer rim 87 of the disk 56 and toward the clamping blocks 81, 83, 84 and 85, while the other pole faces inwardly toward the clamping block 82. In the particular embodiment illustrated, each of the ribbons has its north pole facing inwardly and its south pole facing outwardly.

Mounted to the clamping block 82 and positioned about the central axis 27 are three permanent magnets 90, 91 and 92 which are held to the block 82 by clamps 94. Each of the magnets 90, 91 and 92 is oriented with its north pole facing in the general direction toward the target nest with its south pole facing generally toward the plate 56. In the particular embodiment illustrated, the north pole of magnet 90 is inclined at an angle of approximately 45 degrees toward the central axis 27 while the magnets 91 and 92 are oriented parallel to the axis 27 (see FIGS. 3 and 4, respectively).

Figure 5:
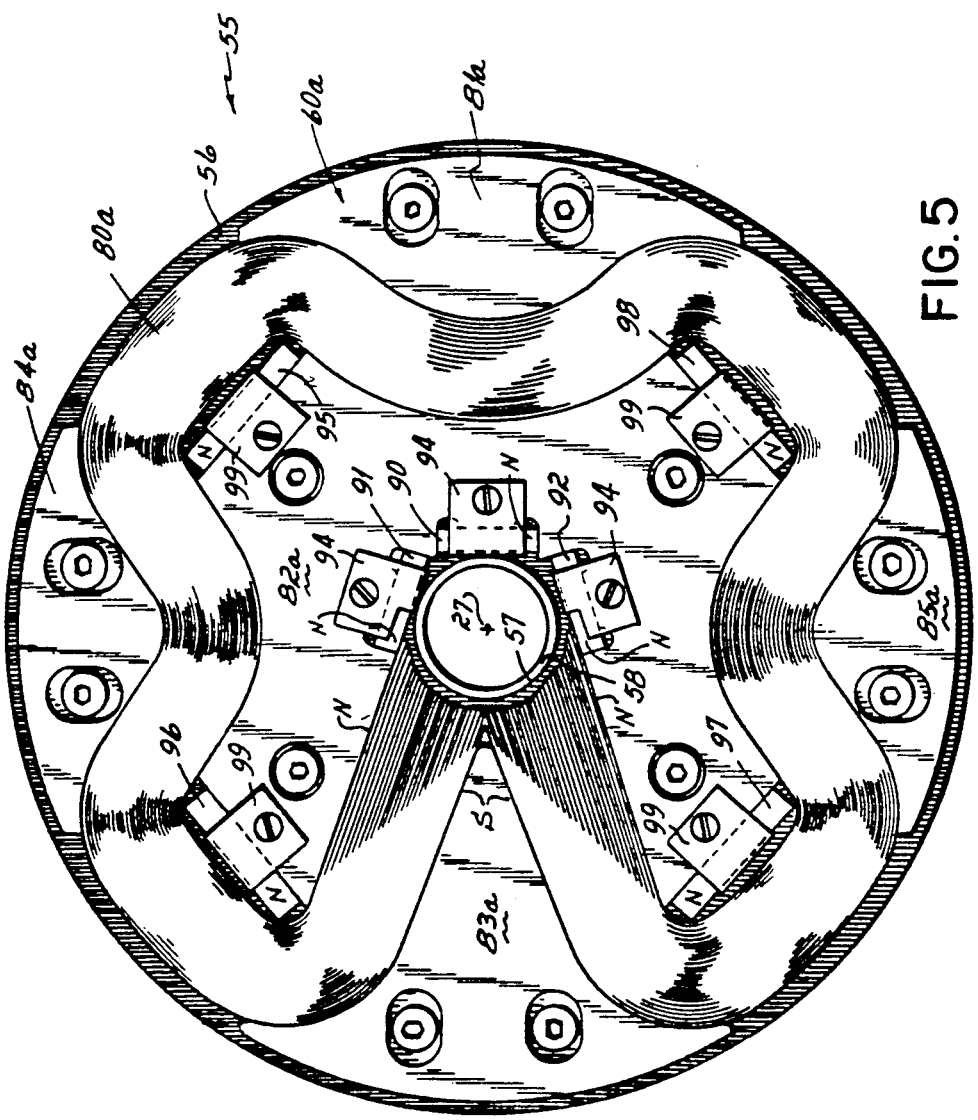
FIG. 5 is a view similar to FIG. 2 illustrating an alternative rotating magnet assembly configuration.

In FIG. 5, an alternative embodiment of magnet structure 60a is illustrated which is differently shaped than the magnet 60 of the embodiment of FIG. 2. The ribbon magnet 80a of the magnet structure 60a is secured to the disk 56 through appropriately shaped clamping blocks 81a-85a. In this embodiment there is also provided additional permanent magnets 95, 96, 97 and 98 clamped to the block 82a by clamps 99 and oriented with their north poles facing towards the target and nest, their south poles toward the plate 56 and their axes generally parallel to the axis 27 of the cathode assembly.

The magnets are arranged on the carrier plate 56 to cause sputtering from the target 40 to be distributed in such a way as to achieve a desired distribution, usually a uniform distribution, of the coating material on the substrate 20. With a generally circular target 40 and circular substrate 20, with a magnet assembly that rotates about the axis 27 through the centers of the target 40 and substrate 20, as in the illustrated embodiments, the relative average sputtering rate will be constant at any given radius from the target center, but may vary with the distance from the axis 27. The variation will be a function of the average intensity of ion bombardment of the target surface at any given radius, which is in turn a function of the average plasma density over the area of the target at that the given radius. This variation will generally be proportional to the portion of a circle at any given radius which is enclosed by the magnetic field. Integrating the plasma density around such circles will yield the approximate relative sputtering from the target surface 41 at the given radius from the target center.

To obtain erosion of all parts of the target, it is necessary that the plasma be present for some portion of the rotation of the magnet assembly over every region of the target. This is desirable even over regions where sputtering of material from the target is not necessary, since the total lack of ion bombardment of the target surface at any point usually results in a redeposition of sputtering material. This most often occurs at the edges and center of the target. The difficulty in producing the magnetic field close to the target edge is due in some circumstances to the undesirability in enlarging the cathode assembly to include a large diameter magnet, particularly with a rotating magnet. With a rotating magnet, the presence of the magnet at the axis of rotation causes excessive sputtering at the center, since the magnet will not rotate through the center of the target.

Figure 6:
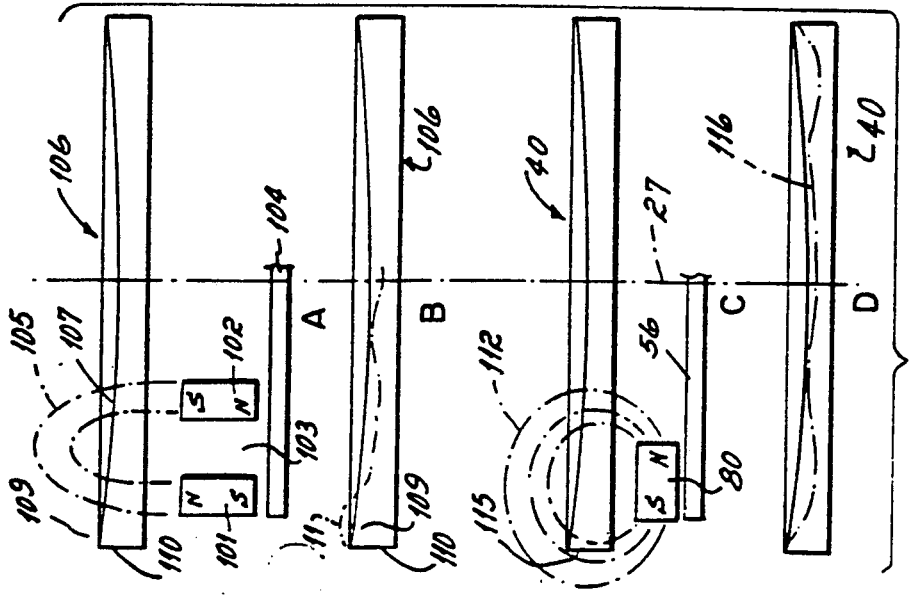
FIG. 6 is a set of diagrams A through D illustrating the preferred magnetic pole orientation for the main magnet according to certain features of the present invention.

As illustrated in FIG. 6, the properties of one of the features of the present invention is presented in a series of diagrams A through D. In diagram A of FIG. 6, a magnet arrangement is illustrated wherein a pair of magnets 101 and 102 are spaced opposite a gap 103 on a steel carrier 104 to produce a magnetic field 105 over the target 106. The lines of the field 105 generally emerge from the surface 107 of the target 106 approximately perpendicular to the surface and immediately above the magnets 101 and 102. Unless the magnet structure is enlarged with respect to the target 106, this often results in a region 109 adjacent the edge 110 of the target 106 that is too remote from the plasma trapped by the field 105 to receive a bombardment of ions to cause sputtering. As a result, sputtering material may be redeposited on the region 109 of the target 106, as illustrated by the erosion profile 111 in diagram B of FIG. 6.

As illustrated in diagram C of FIG. 6, in accordance with one of the features of the present invention, the magnet 80 is oriented on the carrier plate 56 with the poles spaced parallel to the target so that the field lines 112 emerge from and reenter the magnet 80 with a component which is angled along the radius of the target 40, most importantly in a direction away from the center and encircling the target edge 115. As a result, a portion of the plasma is sufficiently close to the edge to cause enough sputtering from the region near the edge of the target 40 to prevent an accumulation of redeposited sputtered material, and to sputter any additional material from the edge as may be desired. As a result, the eroded profile of the target is in accordance with that shown at 116 in diagram D of FIG. 6.

Figure 7:
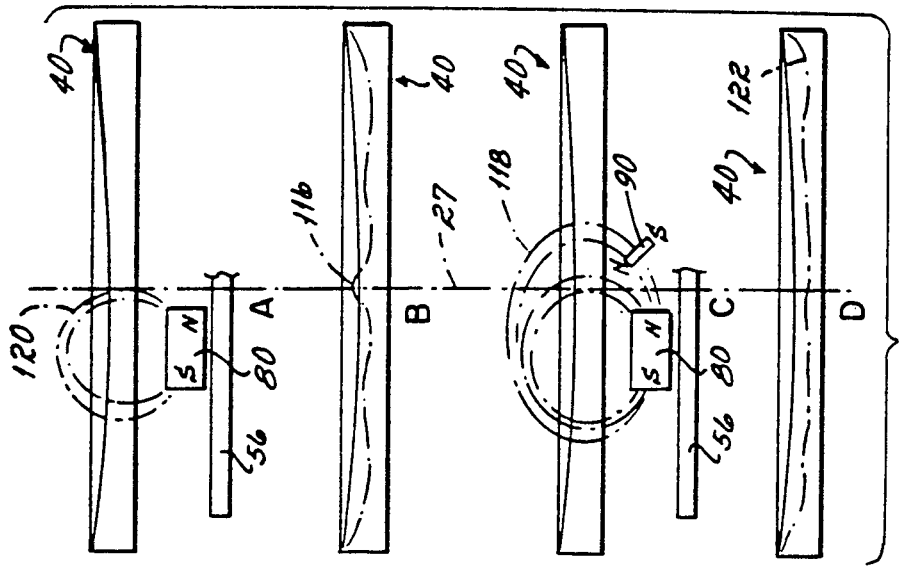
FIG. 7 is a set of diagrams A through D illustrating a preferred auxiliary magnetic arrangement according to certain features of the present invention.

Producing a desired sputtering rate at the center of the target, according to other features of the present invention, is illustrated in the diagrams of FIG. 7. Referring to diagram A of FIG. 7, the field from the main magnet 80, at its point proximate the center of the target 40, is illustrated in diagram A of FIG. 7. There it is necessary that the field portion 120 be sufficiently spaced from the center axis 27 of the target 40 to prevent excessive erosion and burn-through of the target 40 at the center. As a result, little sputtering occurs at the target center and, accordingly, there is a tendency for sputtered material to redeposit and build up at the target center. The provision of the auxiliary magnets 90, 91 and 92, around the axis 27, with their poles oriented so that their fields combine with that of the magnet 80 to produce a resultant field 118, draws sufficient plasma over the target center to cause the redeposited material at the target center to be resputtered from the target, and, in addition, for any other material of the target at the center to be sputtered, without excessive sputtering to occur at the target center, as illustrated by the erosion profile 122 in diagram D of FIG. 7.

Figure 8:
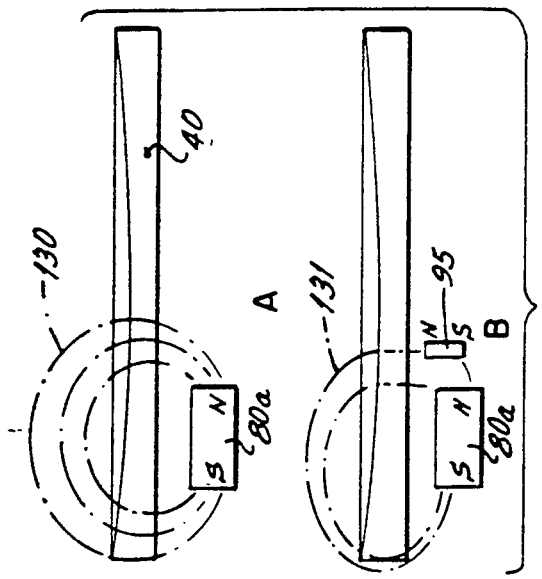
FIG. 8 is a set of diagrams A and B illustrating a preferred auxiliary magnetic arrangement according to other features of the present invention.

Auxiliary magnets such as the magnets 95-98 in FIG. 5, according to other features of the present invention, cooperate with the main magnet 80a of FIG. 5, to sharpen and reshape the field to redistribute the erosion of the target. As illustrated in diagram A of FIG. 8, the field 130 of the magnet 80a may, for example, cause excessive sputtering along one edge, for example the inner edge, of the magnetic tunnel. By provision of the auxiliary magnet 95, for example, as illustrated in diagram B of FIG. 8, the resultant field 131 is reshaped to better achieve the erosion and sputtering distribution characteristics desired.

The magnets 80 and 80a are dimensioned so as to project a slight distance, approximately 1/32 inch, into the space 44 between the back of the target nest and the carrier 56, leaving a clearance between the magnet and the nest back of, for example 1/16 inch between the magnet and about 3/32 inch between the magnet retaining blocks 81-84 and 81a-84a and the nest back. The magnets 80, 80a, because of their serpentine shape, thus turbulently move the cooling water through the space 44 as the magnet assembly 50 rotates. This causes the water or other cooling liquid being used to more effectively remove heat from the nest 42 and to facilitate circulation of the water from the central portion toward the outer portion of the space 44 by a centrifugal pumping action, as shown by the arrow 140 in FIG. 1. With this feature, the apparatus may be oriented with the substrate horizontal, but if in a vertical plane, is preferably with oriented upward direction being the direction of the arrow 142 in FIG. 1, and with the cooling water outlet 63 at the top or high point in the space 44.

Having described the invention in its preferred embodiments, the following is claimed:

1. A magnetron sputter coating apparatus for sputter coating a substrate in a pressure sealed chamber, the apparatus comprising:

a substrate holder having means thereon for supporting the substrate in the chamber;

a target holder having means thereon for supporting a target of sputter coating material having a sputtering surface thereon, the target being supported thereby in the chamber with the sputtering surface generally parallel to and facing the substrate;

a magnet carrier positioned behind the target opposite the sputtering surface thereof and mounted to rotate with respect to the target and substrate about an axis which intersects the target and substrate;

means for rotating the carrier on the axis;

a main magnet secured so as to rotate with the carrier, the magnet being of a continuous strip of magnetic material arranged to form a closed loop, the strip having an inner periphery of one polarity and an outer periphery of the opposite polarity and producing a magnetic field which forms a closed magnetic tunnel trapping a plasma thereunder and which rotates over the sputtering surface of the target about the axis as the carrier rotates; and a plurality of clamping blocks including at least one inner block mounted to the carrier adjacent at least a portion of the inner periphery of the strip and at least one outer block mounted to the carrier adjacent the outer periphery of the strip to clamp the strip therebetween, the blocks being so shaped and positioned on the carrier to define the shape and position of the loop on the carrier.

2. The apparatus of claim 1 in which the target is bounded by an outer rim wherein:

the loop includes at least one radially outward section of the magnetic material moveable with the carrier, remote from the axis and underlying the sputtering surface near the rim of the target, to produce at least some sputtering of the target surface adjacent the rim, and at least one radially inward section of the magnetic material moveable with the carrier underlying the sputtering surface near, but not at, the axis, each of the sections being shaped and positioned by the shapes and positions of the clamping blocks.

3. The apparatus of claim 2, wherein:

the carrier has mounted thereon magnetic field shaping means distinct from the strip and located with respect to the axis such that a portion of the plasma trapped by the tunnel is caused by the shaping means to extend to and be present sufficiently near the sputtering surface adjacent the axis to cause at least some sputtering from the sputtering surface at the axis.

4. The apparatus of claim 3 further comprising:

the magnetic field shaping means includes at least one auxiliary magnet mounted for rotation with the carrier and located near the inward section of the loop so as to produce a field which will combine with the field formed by the main magnet to cause a portion of the plasma to extent sufficiently near the sputtering surface at the axis so as to cause at least some sputtering from the sputtering surface at the axis.

5. The apparatus of claim 1 in which the target is bounded by an outer rim and wherein:
the loop includes at least one radially outward section of the magnetic material moveable with the carrier, remote from the axis and underlying the sputtering surface near the rim of the target, to produce at least some sputtering of the target surface adjacent the rim, and at least one radially inward section of the magnetic material moveable with the carrier underlying the sputtering surface near the axis, each of the sections being shaped and positioned by the shapes and positions of the clamping blocks;
the clamping blocks at the outer section of the loop being adjacent only the inner periphery.

6. A magnetron sputter coating apparatus for sputter coating a substrate in a pressure sealed chamber, the apparatus comprising:
a substrate holder having means thereon for supporting the substrate in the chamber;
a target holder having means thereon for supporting a target of sputter coating material having a sputtering surface thereon with the sputtering surface generally parallel to and facing the substrate;
a magnet carrier positioned behind the target opposite the substrate and mounted to rotate with respect to the target and substrate in a plane generally parallel to the substrate about an axis which intersects the target and substrate;
means for rotating the carrier on the axis;
a main magnet secured to the carrier so as to rotate therewith, the main magnet being formed of magnetic material arranged to form a closed magnetic loop having an inner peripheral surface of one polarity and an outer peripheral surface of the opposite polarity such that the polar axes along the loop extend generally across the loop and parallel to the plane, the main magnet producing a magnetic field that encloses a closed magnetic tunnel trapping a plasma thereunder which rotates over the sputtering surface of the target about the axis as the carrier rotates; and
at least one auxiliary magnet mounted on the carrier in fixed relation to the main magnet for rotation with the carrier, the auxiliary magnet having a polar axis lying outside of the plane and being located near a portion of a peripheral surface of the loop so as to produce a field that combines with a reshapes the field formed by the main magnet to modify the position or strength of the plasma in a section of the tunnel adjacent the portion.

7. The apparatus of claim 6 wherein:
the main magnet is a permanent magnet.

8. A method of manufacturing a disc shaped sputter coated article in a pressure sealed chamber, the method comprising the steps of:
supporting a generally circular wafer centered on an axis in a vacuum processing chamber;
supporting a target on the axis in the chamber with a sputtering surface of the target generally facing the article with the target having a thickness which varies with the distance from the axis so as to provide sputtering material in accordance with a predetermined distribution across the sputtering surface of the target;
providing a magnet formed of a closed loop of magnetic material behind the target opposite the sputtering surface thereof and producing therewith a closed plasma trapping magnetic tunnel therewith over the sputtering surface of the target; the magnet being shaped so as to affect the intensity of duration of the plasma at different radii from the axis to utilize the sputtering material in accordance with the predetermined distribution across the sputtering surface upon the rotation of the magnet about the axis;
energizing the target to produce a plasma, on the surface of the target within the tunnel, of gas within the chamber;
rotating the magnet about the axis to rotate the tunnel and the plasma and thereby sputter material onto the article from the target at different radii thereof approximately in accordance with the predetermined distribution.

9. The method of claim 8 further comprising the step of:
providing auxiliary magnet field shaping means distinct from the magnet and mounted to rotate in fixed relation to a section of the magnet to produce an auxiliary magnetic field to combine with and reshape the field formed by the magnet to modify the position or strength of the plasma adjacent the section.

10. The method of claim 9 wherein the auxiliary magnetic field shaping means includes:
at least one auxiliary magnet mounted for rotation with the magnet and to produce the field which will combine with and reshape the field formed by the magnet to modify the position or strength of the plasma adjacent the section.

11. A magnetron sputter coating apparatus for sputter coating a substrate in a pressure sealed chamber, the apparatus comprising:
a substrate holder having means thereon for supporting the substrate in the chamber;
means for mounting a target of sputter coating material having a sputtering surface thereon surrounded by an outer rim, in the chamber with the sputtering surface generally facing the substrate;
a magnet carrier positioned behind the target opposite the sputtering surface thereof and mounted to rotate with respect to the target and substrate about an axis which intersects the target and substrate;
means for rotating the carrier on the axis;
a main magnet secured so as to rotate with the carrier, the magnet being arranged in a closed loop, the magnet being positioned on the carrier and shaped to produce a magnetic field which forms a closed magnetic tunnel trapping a plasma thereunder, a part of the tunnel lying at each radii from proximate, but not at, the axis to approximately the outer rim, and which rotates over the sputtering surface of the target about the axis as the carrier rotates; and
auxiliary magnetic field shaping means distinct from the main magnet and located with respect to the axis so as to reshape the field of the main magnet such that a portion of the plasma extends sufficiently near the sputtering surface proximate the axis so as to cause at least some sputtering from the sputtering surface at the axis.

12. The apparatus of claim 11 wherein:
the magnetic field shaping means includes at least one auxiliary magnet mounted on the carrier to rotate therewith.

13. The apparatus of claim 12 wherein:
the loop includes a radially outward section of the magnetic material moveable with the carrier remote from the axis and underlying the sputtering surface near the rim of the target and a radially inward section of the magnetic material moveable with the carrier underlying the sputtering surface near the axis.

14. The apparatus of claim 13 wherein the auxiliary magnet is located proximate the inward section of the loop so as to produce a field which will combine with the field of the main permanent magnet to cause a portion of the plasma to extend sufficiently near the sputtering surface at the axis to cause at least some sputtering therefrom.

15. A magnetron sputter coating apparatus for sputter coating a substrate in a pressure sealed chamber, the apparatus comprising:
a substrate holder having means thereon for supporting a substrate in the chamber;
means for mounting a target of sputter coating material, having a sputtering surface thereon surrounded by an outer rim, in the chamber with the sputtering surface generally facing the substrate;
a magnet carrier positioned behind the target opposite the sputtering surface thereof and mounted to rotate with respect to the target and substrate about an axis which intersects the target and substrate;
means for rotating the carrier on the axis;
a main magnet secured so as to rotate with the carrier, the magnet being arranged in a closed loop and having inner and outer closed peripheral surface, the magnet having a magnetic field which forms a closed magnetic tunnel on the sputtering surface of the target, thereby trapping a plasma thereunder and which rotates over the sputtering surface of the target about the axis as the carrier rotates; and
at least one auxiliary magnet mounted on the carrier to rotate therewith and located sufficiently near a peripheral surface of the loop at a section of the loop in fixed relation thereto, the auxiliary magnet having a different axis of polarization than the main magnet at the section, so as to produce a field which combines with the reshapes the field at the section of the main magnet to modify the position or strength of the plasma on the sputtering surface adjacent thereto.

16. The apparatus of claim 15 wherein the tunnel extends near to, but not through, the axis and the auxiliary magnet is located so as to cause a portion of the plasma trapped under the tunnel to extend sufficiently near the area of the sputtering surface at the axis to cause at least some sputtering therefrom.

17. The apparatus of claim 15 wherein the target has a thickness which varies with the distance from the axis so as to provide sputtering material in accordance with a predetermined distribution across the sputtering surface of the target and wherein:
the auxiliary magnet is positioned so as to produce a field to combine with the field of the main magnet to affect the intensity and duration of the plasma at different radii from the axis so as to sputter and thereby utilize the sputtering material in accordance with the predetermined distribution across the sputtering surface.

18. A method of manufacturing a sputter coated article supported on a holder in a pressure sealed chamber, with a target of sputter coating material having a sputtering surface thereon surrounded by an outer rim, the target being supported in the chamber with the sputtering surface generally facing the article to be coated, the method comprising the steps of:
generating a plasma over the sputtering surface;
producing with a main magnet located behind the target opposite the sputtering surface thereof a magnetic field and forming therewith a closed magnetic tunnel over the sputtering surface of the target and trapping the plasma therewith;
providing adjacent a section of the tunnel, an auxiliary magnet having an axis of polarization different than that of the main magnet at the section, and reshaping with the auxiliary magnet at least part of the tunnel such that a portion of the plasma is redistributed on the sputtering surface thereby; and
rotating the magnets about an axis that intersects the sputtering surface to move the plasma around the axis and across the sputtering surface of the target by rotating the tunnel thereover and sputter coating the article thereby.

19. The method of claim 18 wherein:
the tunnel reshaping step further includes the step of extending at least part of the field across the axis such that a portion of the plasma is present sufficiently near the sputtering surface adjacent the axis to cause at least some sputtering from the sputtering surface at the axis.

20. The method of claim 18 further comprising the step of:
employing at least one auxiliary magnet mounted for rotation with the main magnet adjacent the section, and to produce a field which will combine with and reshape the field formed by the main magnet to modify the position or strength of the plasma adjacent to the section.

21. A method of manufacturing a sputter coated article centered on an axis and supported on a holder in a pressure sealed chamber, with a target of sputter coating material centered on the axis having a sputtering surface thereon surrounded by an outer rim, the target being supported in the chamber with the sputtering surface generally facing the article to be coated, the method comprising the steps of:
generating a plasma over the sputtering surface;
producing with a main magnet located behind the target opposite the sputtering surface thereof a magnetic field and forming therewith a closed magnetic tunnel over the sputtering surface of the target and trapping the plasma therewith, at least part of the tunnel lying at each radius from near, but not at, to approximately the rim;
positioning on the carrier generally opposite the axis from the part of the tunnel lying near thereto auxiliary magnetic field shaping means distinct from the main magnet and reshaping therewith at least part of the field to extend the field across the axis such that a portion of the plasma is present sufficiently near the sputtering surface adjacent the axis to cause at least some sputtering from the sputtering surface at the axis; and
rotating the magnets in fixed spaced relation to each other about the axis to move the plasma across the sputtering surface of the target by rotating the tunnel thereover to sputter the target from the axis to its rim and sputter coating the article thereby.

22. The method of claim 21 wherein the field shaping means positioning step includes the step of:
employing at least one auxiliary magnet mounted for rotation with the main magnet and to produce a field which will combine with and reshape the field formed by the main magnet to modify the position or strength of the plasma adjacent to the auxiliary magnet.

* * * * *

UNITED STATES PATENT AND TRADEMARK OFFICE
CERTIFICATE OF CORRECTION

PATENT NO. : 5,130,005
DATED : July 14, 1992
INVENTOR(S) : Steven Hurwitt, Robert Hieronymi and Israel Wagner It is certified that error appears in the above-identified patent and that said Letters Patent is hereby corrected as shown below:

Col. 4, line 43, "flow of the water and the" should be -- flow of the water and the cooling effect thereof. --

Col. 5, line 14, "U.S. patent application" should be -- U.S. Patent Application --

Col. 7, line 1, "through a bearing assembly through" should be -- through a bearing assembly 59 through --

Col. 11, line 49, "combines with a reshapes" should be -- combines with and reshapes --

Col. 12, line 4, "affect the intensity of duration" should be -- affect the intensity or duration --

Col. 13, line 43, "which combines with the reshapes" should be -- which combines with and reshapes --

Signed and Sealed this

Eighth Day of February, 1994

Attest:

BRUCE LEHMAN

Attesting Officer    Commissioner of Patents and Trademarks